United States Patent
Biberger et al.

(10) Patent No.: US 10,615,002 B2
(45) Date of Patent: Apr. 7, 2020

(54) METHOD FOR OPERATING A PLURALITY OF FIB-SEM SYSTEMS

(71) Applicant: Carl Zeiss Microscopy GmbH, Jena (DE)

(72) Inventors: Josef Biberger, Wildenberg (DE); Ralph Pulwey, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 16/515,341

(22) Filed: Jul. 18, 2019

(65) Prior Publication Data

US 2020/0027696 A1    Jan. 23, 2020

(30) Foreign Application Priority Data

Jul. 19, 2018 (DE) .................. 10 2018 117 492

(51) Int. Cl.

| | |
|---|---|
| *H01J 37/305* | (2006.01) |
| *H01J 37/302* | (2006.01) |
| *H01J 37/08* | (2006.01) |
| *H01J 37/06* | (2006.01) |
| *G01N 1/32* | (2006.01) |
| *H01J 37/28* | (2006.01) |

(52) U.S. Cl.
CPC .......... *H01J 37/3056* (2013.01); *G01N 1/32* (2013.01); *H01J 37/06* (2013.01); *H01J 37/08* (2013.01); *H01J 37/28* (2013.01); *H01J 37/3023* (2013.01); *H01J 2237/0822* (2013.01); *H01J 2237/31749* (2013.01)

(58) Field of Classification Search
CPC .. H01J 37/06; H01J 37/08; H01J 37/28; H01J 37/302; H01J 37/3023; H01J 37/3056; H01J 2237/0822; H01J 2237/31749; G01N 1/32
See application file for complete search history.

(56) References Cited

U.S. PATENT DOCUMENTS

| | | |
|---|---|---|
| 6,797,969 B2 | 9/2004 | Gerlach et al. |
| 2008/0078742 A1 | 4/2008 | Hu et al. |
| 2010/0116977 A1 | 5/2010 | Young et al. |

(Continued)

OTHER PUBLICATIONS

German Office Action, with translation thereof, for corresponding DE application No. 10 2018 117 492.6 dated Apr. 24, 2019.

(Continued)

*Primary Examiner* — David E Smith
(74) *Attorney, Agent, or Firm* — Fish & Richardson P.C.

(57) ABSTRACT

Processes may be performed with a plurality of FIB-SEM systems. A first process group includes recording an image with the electron beam column, depositing material with supply of a process gas, and performing ion beam etching. A second process group includes performing a sample exchange, exchanging a reservoir of a gas source for the process gas, and verifying an image that was recorded with the electron beam column. The processes of the second group are prioritized. The FIB-SEM systems are actuated to work through processes contained in process lists. If in a plurality of FIB-SEM systems processes of the second group are to be performed simultaneously, an instruction based on the prioritization is output to the user.

8 Claims, 3 Drawing Sheets

(56) References Cited

U.S. PATENT DOCUMENTS

| | | | |
|---|---|---|---|
| 2011/0006207 A1* | 1/2011 | Arjavac | G01N 1/32 250/307 |
| 2011/0017927 A1* | 1/2011 | Zaykova-Feldman | G01N 1/32 250/559.01 |
| 2015/0136977 A1* | 5/2015 | Buxbaum | G01N 1/32 250/307 |

OTHER PUBLICATIONS

German Notice of Allowance, with translation thereof, for corresponding DE application No. 10 2018 117 492.6 dated Jun. 24, 2019.

* cited by examiner

METHOD FOR OPERATING A PLURALITY OF FIB-SEM SYSTEMS

CROSS-REFERENCE TO RELATED APPLICATIONS

This application claims benefit under 35 USC 119 of German Application No. 10 2018 117 492.6, filed Jul. 19, 2018. The entire disclosure of this application is incorporated by reference herein.

FIELD

The disclosure relates to methods for operating a plurality of FIB-SEM systems.

BACKGROUND

A conventional FIB-SEM system includes an electron beam column for directing an electron beam onto a work region and an ion beam column for directing an ion beam onto the work region. Both the electron beam and the ion beam can be scanned over an object that is arranged in the work region. A detector is provided to detect signals that are triggered by the electron beam that is directed onto the sample or by the ion beam that is directed onto the sample. In this way it is possible to scan the ion beam or the electron beam over the object and to assign the signals that are detected during scanning to the instantaneous scanning location of the ion beam or electron beam so as to obtain a particle-microscopic image of the object. It is furthermore possible to remove material from the object using the ion beam. Furthermore, a gas source may be provided to feed a process gas to the work region. Depending on the type of process gas, a chemical reaction can be triggered by the ion beam or electron beam that is incident on the object to remove material from the object or deposit material on it.

FIB-SEM systems are therefore used for structuring and machining miniaturized objects. One example of the use of FIB-SEM systems is the production of TEM samples. TEM samples are thin material samples having a thickness of, for example, 0.05 µm to 0.7 µm and are suitable for being examined using a transmission electron microscope (TEM). TEM samples can be separated out of a material volume that is to be examined by way of an FIB-SEM system.

In the semiconductor industry, for example, demand for separated-out TEM samples is high, which means that a plurality of FIB-SEM systems are operated at the same time there at specific locations. Attempts are being made to optimize the operation of the plurality of FIB-SEM systems with respect to the throughput that is attainable. And yet, the attainable throughput in FIB-SEM systems is considered to be in need of improvement.

SUMMARY

The present disclosure seeks to provide a method for operating a plurality of FIB-SEM systems with which the throughput can be increased.

According to embodiments of the disclosure, a plurality of FIB-SEM systems are operated at the same time. Here, each of the FIB-SEM systems includes an electron beam column for directing an electron beam onto a work region and an ion beam column for directing an ion beam onto the work region. The FIB-SEM systems can in each case include one or more detectors that are configured to detect signals that are triggered by the electron beam or the ion beam at an object that is arranged in the work region. The FIB-SEM systems can furthermore include in each case a gas source that is configured to feed a process gas to the work region.

According to exemplary embodiments, the FIB-SEM systems are configured such that they can be used to perform in each case a plurality of predefined processes. Examples of such processes are: recording an image of an object that is arranged in the work region with the electron beam column, recording an image of the object with the ion beam column, performing ion beam etching without supply of a process gas, performing ion beam etching with supply of a process gas, depositing material on the object without supply of a process gas under irradiation by the electron beam, depositing material on the object with supply of a process gas under irradiation by the electron beam, performing a sample exchange, that is to say removing or inserting an object to be processed from or into an FIB-SEM system, exchanging a reservoir of a gas source for the process gas, verifying an image that was recorded with the electron beam column, verifying an image that was recorded with the ion beam column, etc.

According to embodiments of the disclosure, the predefined processes that can be performed using the FIB-SEM system are divided into at least two groups. A first one of the groups includes predefined processes that an FIB-SEM system can perform automatically without the assistance of the user. That means that the components of the FIB-SEM system can be actuated by a controller of the FIB-SEM system such that the predefined process is carried out with the FIB-SEM system. For example, the first group of processes includes the following processes: Recording an image with the electron beam column, depositing material with supply of a process gas, and performing ion beam etching.

The second group of processes includes processes that the FIB-SEM system must perform with the assistance of the user. That means that it is not possible simply by actuating the elements of the FIB-SEM system to perform the processes of the second group not only partially but completely. Rather, assistance by a user or operator of the plurality of FIB-SEM systems is involved in each case to perform the processes of the second group. One example of a process of the second group of processes is performing a sample exchange. In order to remove a sample from an FIB-SEM system or to insert a sample into the FIB-SEM system, a vacuum lock of the FIB-SEM system must be opened so as to transfer the sample through this lock into or out of the FIB-SEM system. The user must manually intervene for example when opening the vacuum lock. Furthermore, the user must manually intervene for example to remove the sample for example from a transport cassette and feed it through the vacuum lock into the FIB-SEM system or to slide the sample into a transport cassette and remove it from the FIB-SEM system.

Another example of a process of the second group is exchanging a reservoir of the gas source for the process gas. In some of the predefined processes, process gas from a gas source is fed to the work region. The fed process gas is stored in a reservoir. If the reservoir is empty, the predefined process that involves supply of the process gas can no longer be performed. Thus, the reservoir is replaced when it is empty or before it is empty. The exchange includes for example decoupling the existing reservoir from the gas source and coupling a new reservoir to the gas source. For this procedure, manual intervention of the user or operator is involves.

A further example of a process of the second group of processes is verifying an image that was recorded with the electron beam column. Working through a series of predefined processes frequently includes recording an image of the object in its instantaneous state and verifying the image by the user. Verifying includes that the user visually checks the image and finds it to be in order. If the user finds that the image is in order, working-through the predefined list of processes can continue. If the user finds that the image is not in order, it is possible for example to deduce the presence of a defect. It is then possible for example to make a decision as to whether to in fact continue working through the predefined list of processes or whether work on the list should be interrupted and a new task should be started. Verifying the image includes that the user visually inspects the image that was recorded by the electron beam column and is presented for example on a screen, assesses it and communicates the result of the assessment to a controller of the FIB-SEM system using an input tool, such as a keypad or a mouse.

According to exemplary embodiments, the method for operating the plurality of FIB-SEM systems furthermore includes prioritizing the processes of the second group. That means that between each pair of processes of the second group, a relation that results in only one process of the pair is determined. Prioritization can be performed for example such that an integer is assigned to each process of the second group, with the greater number representing the greater priority. Other ways of assigning priorities are possible. It is furthermore possible that two or more processes of the processes of the second group have the same priority.

According to exemplary embodiments of the disclosure, prioritization of the processes of the second group includes assigning a greater priority to the performance of the sample exchange and assigning a comparatively low priority to the exchange of the reservoir of the gas source.

According to exemplary embodiments of the disclosure, prioritization of the processes of the second group includes assigning a greater priority to the verification of the image and assigning a comparatively low priority to the performance of a sample exchange.

According to exemplary embodiments of the disclosure, prioritization of the processes of the second group includes assigning a greater priority to the verification of the image and assigning a comparatively low priority to the exchange of the reservoir of the gas source.

BRIEF DESCRIPTION OF THE DRAWINGS

Embodiments of the disclosure are explained in greater detail below with reference to figures, in which.

DETAILED DESCRIPTION

Figure 1:
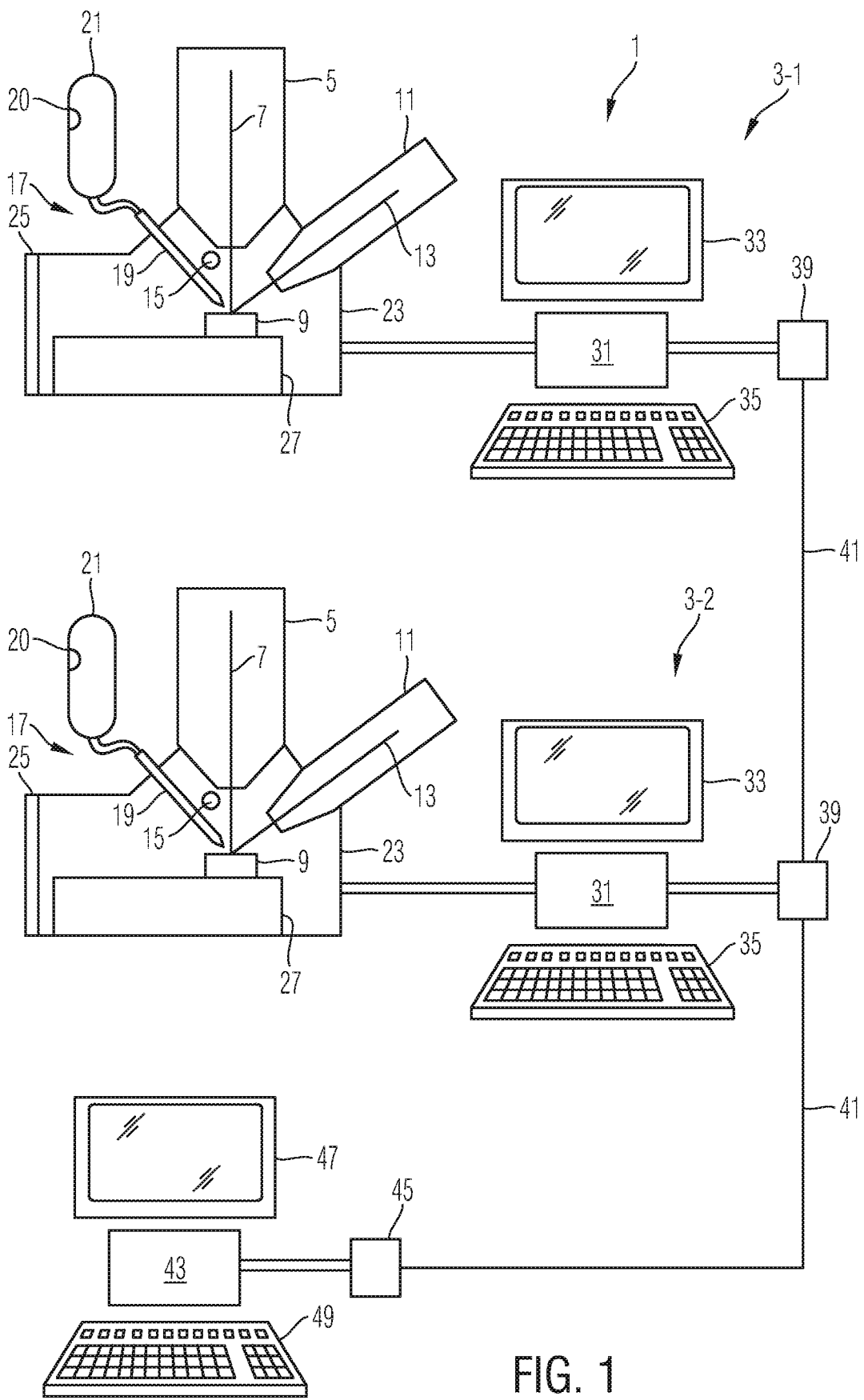
FIG. 1 shows a schematic illustration of a system made up of a plurality of FIB-SEM systems.

FIG. 1 is a schematic illustration of an overall system 1 comprising a first FIB-SEM system 3-1 and a second FIB-SEM system 3-2. The number of exactly two FIB-SEM systems 3-1 and 3-2 of the overall system 1 in the embodiment shown in FIG. 1 is an example. The overall system 1 can include two, three, four, five or more FIB-SEM systems. Each of the FIB-SEM systems 3-1, 3-2 includes an electron beam column 5 that is configured to generate an electron beam 7 and direct it onto an object 9 that is arranged in a work region of the FIB-SEM system and to scan it over the object. The FIB-SEM system furthermore includes an ion beam column 11 that is configured to generate an ion beam 13, direct it onto the object 9, focus the ion beam 13 on the object and to scan it over the object. The FIB-SEM systems furthermore each include a detector 15 that is configured to detect signals, such as electrons, ions, particles, X-rays and light, which are generated by the electron beam 7 that is incident on the object 9 or by the ion beam 13 that is incident on the object 9.

The FIB-SEM systems furthermore include in each case at least one gas source 17 having a supply line 19 to the object 9 and a reservoir 21, the gas source being configured to guide a process gas that is stored in the reservoir 21 via the supply line 19 to the object 9. The supplied process gas can be excited on the surface or near the surface of the object 9 by the electron beam 7 or the ion beam 13 to trigger a chemical reaction between components of the process gas and the material of the object 9 to either remove material from the object 9 or to deposit material on the object 9. The gas source 17 can include a sensor 20 to measure the quantity of the process gas contained in the reservoir 21 or to output a warning signal if the quantity of process gas contained in the reservoir 21 falls below a predetermined value.

The FIB-SEM systems furthermore include a vacuum jacket 23 to which the electron beam column 5, the ion beam column 11 and the gas source 17 are attached and in which the object 9 that is to be processed using the FIB-SEM system is arranged. The interior of the vacuum jacket 23 is able to be evacuated by way of a vacuum pump (not illustrated) to create a vacuum therein that permits operation of the ion beam column 11 and the electron beam column 5.

The vacuum jacket 23 includes a vacuum lock 25 that is closed when the vacuum is inside the vacuum jacket 23 and that can be opened to remove the object 9 from the FIB-SEM system and insert another object to be processed into the FIB-SEM system. To this end, the FIB-SEM system includes an object holder 27 that is configured to receive the object inserted through the vacuum lock 25 and to position it relative to the electron beam column 5 and the ion beam column 11 such that a surface of the object 9 is arranged in a work region of the two particle beam columns.

The FIB-SEM systems furthermore each include a controller 31 that includes for example working memories, one or more processors and a plurality of electronic interfaces for the components of the FIB-SEM system for controlling them. The controlled components of the FIB-SEM system include for example components of the electron beam column 5, such as lens elements for focusing the electron beam 7, beam deflectors for the electron beam 7 for directing it onto selectable locations on the surface of the object 9 or for scanning it over the surface of the object 9, components of the ion beam column 11, such as lens elements for focusing the ion beam 13, beam deflectors for the ion beam 13 for directing it onto selectable locations on the surface of the object 9 or for scanning it over the surface of the object 9, the detector 15, the detection signals of which are read and processed by the controller 31, a valve of the gas source 17 for regulating the flow of process gas to the object 9, sensors that detect the vacuum state inside the vacuum jacket 23 or the closure state of the vacuum lock 25, and the like. The FIB-SEM systems furthermore each include a display medium 33, such as a screen, and an input tool 35, such as a keypad, to form a user interface for interaction between the controller 31 and a user.

The FIB-SEM systems are in each case configured to perform a plurality of predefined processes. The predefined processes can be divided into two groups of processes. The first group of processes includes processes that the FIB-SEM system can perform automatically without the assistance of the user. The processes of the first group include for example recording an image with the electron beam column or the ion beam column, for example by virtue of scanning the electron beam or the ion beam systematically over the surface of the object 9 and analysing the detection signals of the detector 15 by assigning them for example to the instantaneous scanning location of the respective particle beam. The data obtained here represent an image of the object. The image of the object can be presented for example on the display medium 33 or be stored by the controller 31 on a storage medium of the system 1. The processes of the first group of processes can furthermore include performing ion beam etching with supply of the process gas. To this end, the controller 31 actuates the beam deflectors of the ion beam column 11 to direct the ion beam 13 onto the locations of the object at which processing with the ion beam is to be effected. At the same time, a supply valve of the gas source 17 is opened by the controller 31 to allow the process gas to be fed from the reservoir 21 to the object 9. The processes of the first group of processes can furthermore include performing ion beam etching without supply of the process gas.

The second group of processes includes processes that the FIB-SEM system must perform with the assistance of the user. The second group of processes includes at least performing a sample exchange, that is to say removing the object 9 from the vacuum jacket 23 and inserting a new object through the vacuum lock 25, exchanging the reservoir 21 of the gas source, and verifying an image that was recorded with the electron beam column or the ion beam column. These processes involve the interaction with the user and the active intervention of the user. In the case of the performance of the sample exchange, the active intervention of the user includes that the user for example opens the vacuum lock 25 and removes the object 9 from the vacuum jacket 23 and places a new object on the sample holder 27. In the case of the exchange of the reservoir 21 of the gas source 17, the active intervention of the user includes that the user for example decouples the existing reservoir 21 from the supply line 19 and couples a new reservoir to the supply line 19. In the case of the verification of the image, the active intervention of the user includes that the user for example visually inspects and assesses the recorded image that is presented for example on the display medium 33. The interaction with the user includes first, that the user is alerted to the fact that his or her active intervention as part of a process of the second group is involved. This can be done for example by presenting a corresponding notification by way of the display medium 33. Furthermore, the user interface can also include a tone generator to alert the user to the presentation on the display medium 33. When the user has perceived the presentation on the display medium 33, he or she can confirm this for example to the controller 31 by actuating the input tool 35. The user can then perform the desired activity by removing the object 9, exchanging the gas reservoir 21 or visually inspecting the image that is presented on the display medium 33. The user can communicate the completion of the active intervention to the controller 31 by actuating the input tool 35. The actuation can include for example pressing a predetermined key when the vacuum lock 25 is closed again, the new reservoir 21 is connected to the gas source 17 or the presented image is found to be in order. If the presented image is not found to be in order, the user can press a different key on a keypad.

The FIB-SEM systems 3-1, 3-2 furthermore each include an interface 39 for coupling the controller 31 to a network 41, to which a central controller 43 of the system 1 is likewise connected by way of an interface 45 of the central controller 43. The central controller 43 likewise includes a display medium 47, such as a screen, and an input tool 49, such as a keypad, to provide a user interface. The central controller 43 controls the individual FIB-SEM systems 3-1 and 3-2 of the system 1 by controlling the controller 31 of the FIB-SEM systems 3-1, 3-2. In particular, interactions with the user, as described above in connection with the user interface of the controller 31 of the individual FIB-SEM system, can be performed with the user interface of the central controller 43 that is formed by the output medium 47 and the input tool 49. In particular, the user can be alerted by way of a presentation on the output medium 47 to the fact that active intervention in one of the FIB-SEM systems 3-1, 3-2 is involved, and the user can confirm the completion of the active intervention by actuating the input tool 49. In particular, it is therefore possible to dispense with devices 33 and 35 for the user interfaces of the controllers 31 of the individual FIB-SEM systems and to use for these purposes the devices 47 and 49 of the user interface of the central controller 43.

A method for operating one of the FIB-SEM systems 3-1 and 3-2 will be explained below with reference to the flowchart of FIG. 2. This method can be performed by the controller 31 of one of the FIB-SEM systems, the central controller 43 or by the controllers 31 and 43 together. First, in step 101, a process list to be worked through by way of the respective FIB-SEM system 3-1 or 3-2 is received. The process list defines the processes that are to be performed next by the respective FIB-SEM system. For example, the process list defines the processes that are to be performed sequentially to separate a TEM sample out of an object to be examined at a given location and to attach it to a sample holder for a transmission electron microscope. The process list can have been established for example by the controller 43 in accordance with specifications by the user, or can have been received by the controller 43 via a network.

In step 103, a check is performed as to whether all the processes contained in the process list have been worked through. If this is the case, processing continues with step 101 to receive a next process list. If this is not the case, the next process is taken from the process list in step 105. In step 107, a check is performed as to whether the next process is a process of the second group of processes. The second group of processes includes the processes that, when performed by the FIB-SEM system, involve the assistance of the user. If the check in step 107 indicates that the next process is not a process of the second group, the process is automatically performed by the FIB-SEM system in step 109. Next, processing of step 103 continues in which a check is performed as to whether all processes have been worked through.

If the check in step 107 indicates that the next process is a process of the second group, the central controller 43 is informed of this result in step 111. The central controller 43 can inform the user that the FIB-SEM system that is operated in accordance with the method of FIG. 2 involves his or her active intervention. In that case, step 113 waits for the user, and the process of the second group of processes is performed with the assistance of the user in step 115. Next, step 103 continues in which a check is performed as to whether all processes have been worked through.

Figure 3:
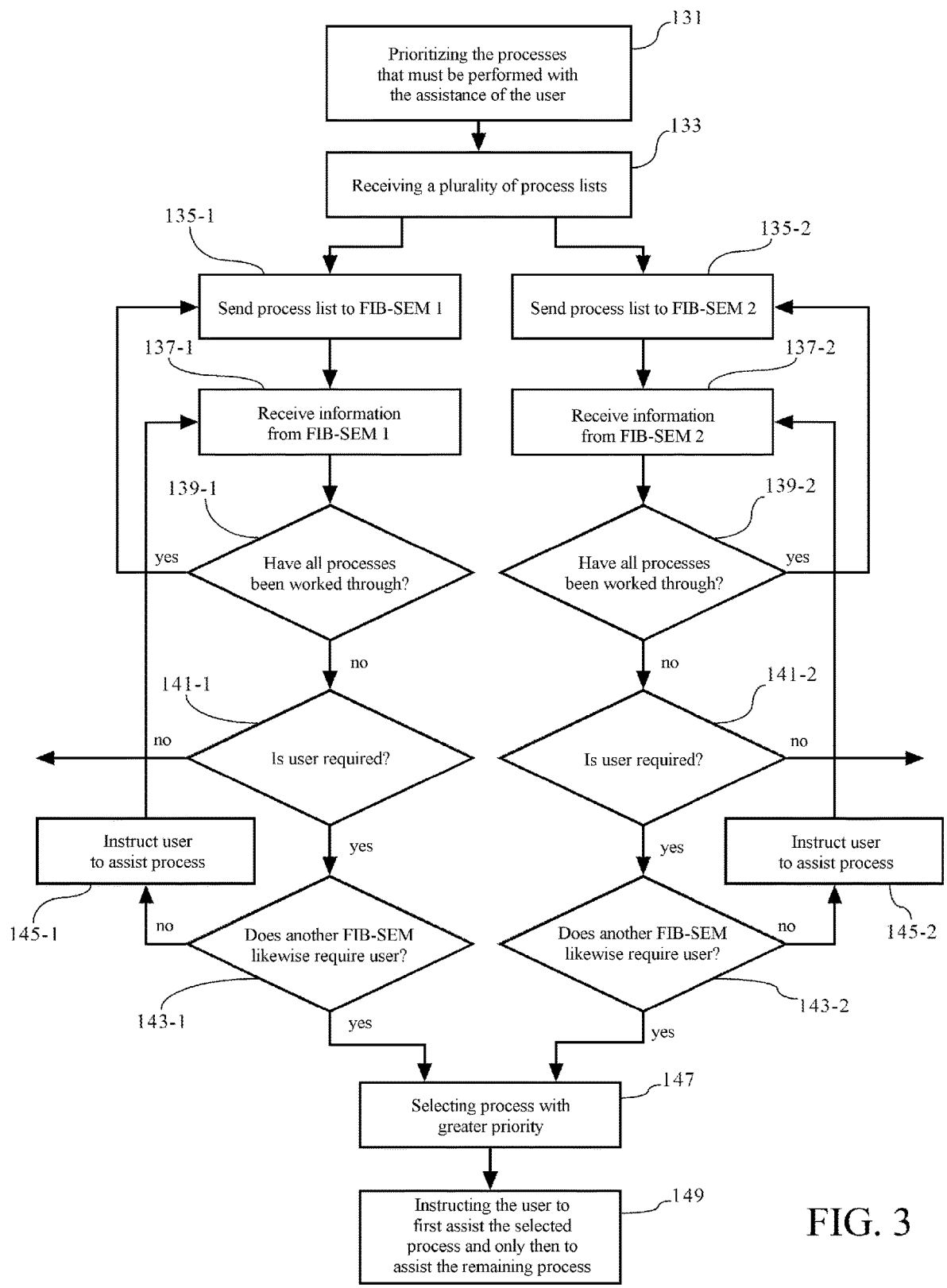
FIG. 3 shows a flowchart for explaining a method for controlling the plurality of FIB-SEM systems of FIG. 1.

A method for operating the system 1 of the plurality of FIB-SEM systems 3-1 and 3-2 will be explained below with reference to FIG. 3. First, in step 131, the processes of the second group, that is to say the processes that the FIB-SEM systems must perform with the assistance of the user, are prioritized. For example, the performance of the sample exchange is assigned a greater priority than the exchange of the reservoir of the gas source, and/or the verification of the image is assigned a greater priority than the performance of the sample exchange, and/or the verification of the image is assigned a greater priority than the exchange of the reservoir of the gas source.

Next, in step 133, a plurality of process lists are received, wherein each process list defines a series of processes that must be worked through by one of the FIB-SEM systems. In each case two of the process lists will then be worked through in parallel, that is to say by simultaneously actuating the individual FIB-SEM systems. When the number of the FIB systems of the system 1 is greater than two, it is also possible for a greater number of process lists to be worked through in parallel.

Working through in parallel includes steps 135-1 and 135-2, in which in each case a next one of the process lists received in step 133 is sent to the FIB-SEM systems 3-1 or to the FIB-SEM system 3-2. The respective process list can be received by the corresponding FIB-SEM system for example in the previously explained step 101 in FIG. 2.

Steps 137-1 and 137-2 wait for the receipt of information from the FIB-SEM systems 3-1 and 3-2, respectively. Once information has been received from the FIB-SEM systems, the type of the information received is checked in subsequent steps 139-1 and 139-2 and 141-1 and 141-2. In particular, a check is performed in steps 139-1 and 139-2 as to whether the respective FIB-SEM system has worked through all processes of the process list that was sent to it previously in step 135-1 and 135-2, respectively, and once again step 101 of FIG. 2 waits for the receipt of the next process list. If this is the case, processing continues with step 135-1 and 135-2, respectively, to send the next process list to the respective FIB-SEM system.

Figure 2:
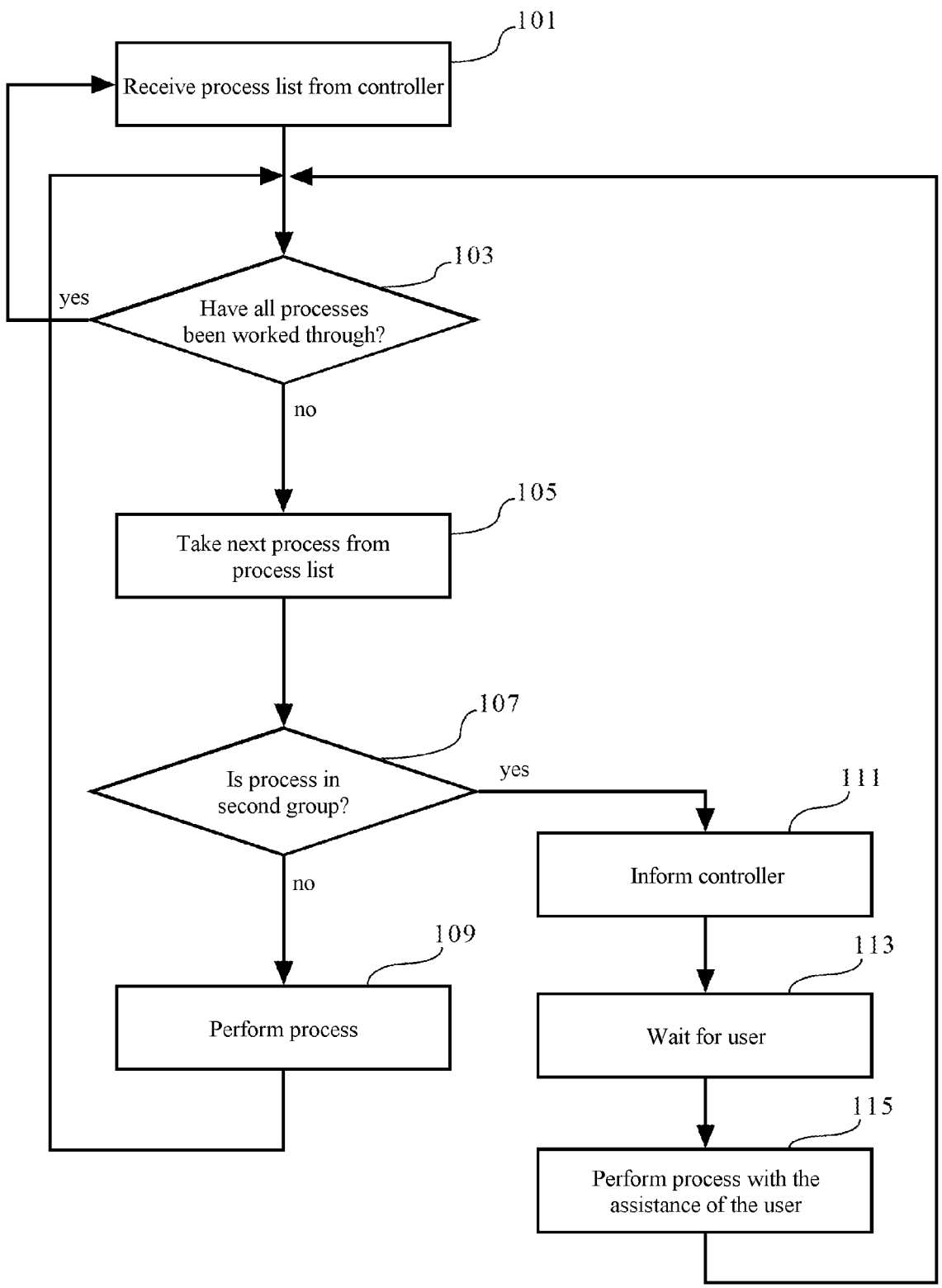
FIG. 2 shows a flowchart of a method that can be performed by each of the FIB-SEM systems shown in FIG. 1.

If this is not the case, a check is performed in step 141-1 and 141-2, respectively, as to whether the information received in step 137-1 and 137-2, respectively, is the information that was output in step 111 of FIG. 2, according to which the respective FIB-SEM system involves the assistance and active intervention of the user and waits for it in step 113 of FIG. 2. If this is not the case, steps (not illustrated in FIG. 3) can be performed to process the information received and to trigger, in dependence thereon, further processes or no further processes. If the check in steps 141-1 or 141-2 indicates that the respective FIB-SEM system involves the assistance and aid of the user for working through the process, a check is performed in step 143-1 and 143-2, respectively, as to whether another FIB-SEM system likewise involves the assistance of the user. If this is not the case, the user is informed of this situation in step 145-1 and 145-2, respectively, and instructed to assist the corresponding FIB-SEM system in the process that is being performed. If the check-in step 143-1 and 143-2 indicates that two (or more) FIB-SEM systems involve the assistance of the user at the same time, a selection is made in step 147. To this end, it is first established which processes of the second group of processes in the two (or more) FIB-SEM systems involve the assistance of the user. The established processes can then be arranged by priority, for example, in a manner such that the process having the greatest priority comes first and the processes with lower priorities come successively lower in the list of priorities. In step 149, the user is informed of this situation and instructed to first assist the selected process in the corresponding FIB-SEM system.

When the user has finished assisting the FIB-SEM system in the process selected in step 147, the respective FIB-SEM system can for example once again send the corresponding information to the central controller 43. Then, it is possible for example to abandon step 149 and to continue in steps 137-1 and 137-2, respectively. Since the process which was not selected previously in step 147 has not yet been worked through, this is established in step 141-1 or 141-2, whereupon the user is alerted to this situation in step 145-1 or 145-2, as described above.

What is claimed is:

1. A method for operating a plurality of FIB-SEM systems, wherein each of the FIB-SEM systems comprises an electron beam column for directing an electron beam onto a work region and an ion beam column for directing an ion beam onto the work region;
    wherein each of the FIB-SEM systems is configured such that they can be used to perform at least a plurality of predefined processes, wherein the plurality of predefined processes comprises at least one first group of processes that the FIB-SEM system can perform automatically without the assistance of the user and comprises a second group of processes that the FIB-SEM system must perform with the assistance of the user,
    wherein the first group of processes comprises at least recording an image with the electron beam column,
    depositing material with supply of a process gas, and performing ion beam etching,
    and the second group of processes comprises at least performing a sample exchange,
        exchanging a reservoir of a gas source for the process gas, and
        verifying an image that was recorded with the electron beam column,
    wherein the method comprises:
    prioritizing the processes of the second group;
    maintaining a process list for each of the FIB-SEM systems, wherein each process list contains a plurality of the predefined processes;
    simultaneously actuating each of the FIB-SEM systems to work through the processes contained in each process list with the respective FIB-SEM system;
    if in a first and a second FIB-SEM system of the plurality of FIB-SEM systems a process of the second group of processes is to be performed simultaneously, selecting the process of the second group that is to be performed currently by the first FIB-SEM system when it has a greater priority than the process of the second group that is to be performed currently by the second FIB-SEM system, and selecting the process of the second group that is to be performed currently by the second FIB-SEM system when it has a greater priority than the process of the second group that is to be performed currently by the first FIB-SEM system; and
    outputting an instruction to the user to assist the respective FIB-SEM system in the performance of the selected process.

2. The method according to claim 1, wherein the prioritization of the processes of the second group comprises:
    assigning a greater priority to the performance of a sample exchange than to the exchange of the reservoir of the gas source.

3. The method according to claim 1, wherein the prioritization of the processes of the second group comprises:

assigning a greater priority to the verification of the image than to the performance of a sample exchange.

4. Method according to claim 1, wherein the prioritization of the processes of the second group comprises:
assigning a greater priority to the verification of the image than to the exchange of the reservoir of the gas source.

5. The method according to claim 2, wherein the prioritization of the processes of the second group comprises:
assigning a greater priority to the verification of the image than to the performance of a sample exchange.

6. Method according to claim 5, wherein the prioritization of the processes of the second group comprises:
assigning a greater priority to the verification of the image than to the exchange of the reservoir of the gas source.

7. Method according to claim 2, wherein the prioritization of the processes of the second group comprises:
assigning a greater priority to the verification of the image than to the exchange of the reservoir of the gas source.

8. Method according to claim 3, wherein the prioritization of the processes of the second group comprises:
assigning a greater priority to the verification of the image than to the exchange of the reservoir of the gas source.

\* \* \* \* \*

UNITED STATES PATENT AND TRADEMARK OFFICE
CERTIFICATE OF CORRECTION

PATENT NO. : 10,615,002 B2
APPLICATION NO. : 16/515341
DATED : April 7, 2020
INVENTOR(S) : Josef Biberger and Ralph Pulwey Page 1 of 1

It is certified that error appears in the above-identified patent and that said Letters Patent is hereby corrected as shown below:

In the Specification

Column 2, Line 65, delete "involves." and insert -- involved. --;

Column 5, Line 22, delete "effected." and insert -- affected. --.

Signed and Sealed this
Twenty-sixth Day of May, 2020

Andrei Iancu
*Director of the United States Patent and Trademark Office*